US009779787B2

(12) United States Patent
Park et al.

(10) Patent No.: US 9,779,787 B2
(45) Date of Patent: Oct. 3, 2017

(54) SYSTEMS AND METHODS FOR PROCESSING DATA

(71) Applicant: Korea University Research and Business Foundation, Seoul (KR)

(72) Inventors: Jong Sun Park, Seoul (KR); Woong Choi, Bucheon-si (KR)

(73) Assignee: Korea University Research and Business Foundation, Seoul (KR)

( * ) Notice: Subject to any disclaimer, the term of this patent is extended or adjusted under 35 U.S.C. 154(b) by 39 days.

(21) Appl. No.: 14/831,231

(22) Filed: Aug. 20, 2015

(65) Prior Publication Data

US 2015/0357012 A1 Dec. 10, 2015

Related U.S. Application Data

(63) Continuation of application No. PCT/KR2014/004324, filed on May 14, 2014.

(30) Foreign Application Priority Data

May 14, 2013 (KR) .................. 10-2013-0054497

(51) Int. Cl.
*G06F 12/00* (2006.01)
*G11C 7/10* (2006.01)
*G11C 11/406* (2006.01)
*H03M 13/11* (2006.01)
*H04L 1/00* (2006.01)

(52) U.S. Cl.
CPC ...... *G11C 7/1072* (2013.01); *G11C 11/40615* (2013.01); *H03M 13/1105* (2013.01); *H04L 1/0061* (2013.01); *G11C 2211/4061* (2013.01)

(58) Field of Classification Search
CPC ...... G11C 11/40615; G11C 2211/4061; G11C 7/1072; H03M 13/1105; H04L 1/0061
USPC ............................................. 711/105
See application file for complete search history.

(56) References Cited

U.S. PATENT DOCUMENTS

2010/0169886 A1* 7/2010 Troxel .................. G06F 11/187
718/101

FOREIGN PATENT DOCUMENTS

| JP | 10-260950 A | 9/1998 |
|---|---|---|
| JP | 2009-519451 A | 5/2009 |
| KR | 2002-0089307 A | 11/2002 |
| KR | 10-0505832 B1 | 8/2005 |
| KR | 2005-0092378 A | 9/2005 |
| KR | 2006-0097565 A | 9/2006 |

OTHER PUBLICATIONS

International Search Report for PCT/KR2014/004324 dated Jun. 27, 2014.

* cited by examiner

*Primary Examiner* — Mardochee Chery
(74) *Attorney, Agent, or Firm* — Fox Rothschild LLP

(57) ABSTRACT

The digital signal processor includes a DRAM including multiple memory cells configured to store data in a parasitic capacitor and a core logic configured to perform an operation of recording, reading, or updating data in the DRAM on the basis of a predetermined digital signal processing architecture. The core logic: records input data in a memory cell of the DRAM; reads the recorded input data before a retention time passes; and externally outputs the data or stores the data in another memory cell of the DRAM.

5 Claims, 6 Drawing Sheets

SYSTEMS AND METHODS FOR PROCESSING DATA

CROSS-REFERENCE TO RELATED APPLICATION

This application is a continuation application of PCT Application No. PCT/KR14/04324 filed on May 14, 2014, which claims the benefit of Korean Patent Application No. 10-2013-0054497 filed on May 14, 2013, the entire disclosures of which are incorporated herein by reference.

TECHNICAL FIELD

The present disclosure generally concerns a digital signal processor and a data inputting/outputting method.

BACKGROUND

A typical digital signal processor (hereinafter, referred to as "DSP") performs specialized signal processing architectures such as a Viterbi decoder, a FFT (Fast Fourier Transform) processor, and a LDPC (Low-density Parity-check Codes) decoder. Generally, the DSP uses an embedded memory to perform such architectures. In this case, as the embedded memory, a logic processor, i.e., a SRAM (static random-access memory) which can be implemented by a general process is mainly used.

Meanwhile, as for the embedded memory used in the DSP, read and write access patterns are determined by an architecture. Therefore, as for the embedded memory used in the DSP, exact timings for reading and writing can be predicted by analysis of architecture. A memory access pattern of a DSP module will be described as follows with reference to FIG. 1 and FIG. 2.

FIG. 1 is a diagram illustrating an example of a memory access pattern of a Viterbi decoder. And FIG. 2 is a diagram illustrating an example of a memory access pattern of a FFT processor.

A memory access pattern of a Viterbi decoder as a DSP has a certain rule as illustrated in FIG. 1. Further, the Viterbi decoder has a certain cycle to a last read operation after a write operation. That is, in the Viterbi decoder, a memory access pattern is repeated by 384 cycles, which is a period of time required for completing data input/output. As such, the Viterbi decoder has a certain memory access pattern.

A FFT processor illustrated in FIG. 2 performs memory read and write operations regularly depending on a butterfly architecture. In the FFT processor, the longest period of time during a cycle to a last read operation after a write operation is smaller than the number of cycles per stage. That is, it corresponds to 64 cycles in FIG. 2. Further, a LDPC decoder also has a certain cycle in which a memory access pattern is determined by an architecture.

As such, a DSP operated on the basis of a certain rule such as a certain access pattern and a certain cycle does not need a refresh operation if the DSP uses a SRAM. However, a memory cell of the SRAM is several times greater in size than a memory cell of a DRAM. On the other hand, if a DRAM is used, electric charges stored in a memory cell may continuously leak, a DSP additionally needs a refresh operation. However, the refresh operation in the DRAM consumes a lot of electricity. Therefore, the present disclosure suggests an algorithm of a DSP in which a DRAM is used but a refresh operation may be omitted.

In this regard, Korean Patent Application Publication No. 10-2006-0097565 (entitled "Dynamic random access memories and method for testing performance of the same") discloses a technology that enables screening of a so-called variable retention time (VRT) failure, i.e., a retention failure occurring in a DRAM due to fluctuation of data retention time like a random telegraph noise.

Further, Korean Patent No. 10-0505832 (entitled "Dynamic DRAM refresh rate adjustment based on cell leakage monitoring") discloses a technology that enables designing a DRAM leakage monitor such that it is precharged when a chip enters a self-refresh cycle, measuring a leakage monitor cell, and converting information on a remaining charge level in the cell into digital output signals that will determine a refresh rate for the following refresh cycle.

DISCLOSURE OF THE INVENTION

Means for Solving the Problems

In view of the foregoing, the present disclosure concerns a digital signal processor and a data inputting/outputting method in the digital signal processor that reads input data before a retention time passes, so that it is possible to omit a refresh operation.

As a technical means for solving the above-described problem, there is provided a digital signal processor. The digital signal processor may include a DRAM including multiple memory cells configured to store data in a parasitic capacitor and a core logic configured to perform an operation of recording, reading, or updating data in the DRAM on the basis of a predetermined digital signal processing architecture. The core logic: records input data in a memory cell of the DRAM; reads the recorded input data before a retention time passes; and externally outputs the data or stores the data in another memory cell of the DRAM.

In some scenarios, there is provided a data inputting/outputting method in a digital signal processor. The method may include recording input data in a DRAM including multiple memory cells configured to store data in a parasitic capacitor and reading the recorded input data before a retention time of the DRAM passes, after the input data are recorded. The step of recording and the step of reading are performed on the basis of a predetermined digital signal processing architecture.

Effect of the Invention

Being due to the above-described technical means for solving the problem, a digital signal processor reads input data before a retention time passes, and, thus, there is an effect of omitting a refresh operation.

Further, a DRAM in the digital signal processor has a smaller memory cell area than a SRAM and includes both of an input port and an output port (separated write port and read port), and, thus, an area of a DSP module can be reduced and memory band-width can also be doubled.

MODE FOR CARRYING OUT THE INVENTION

Figure 1:
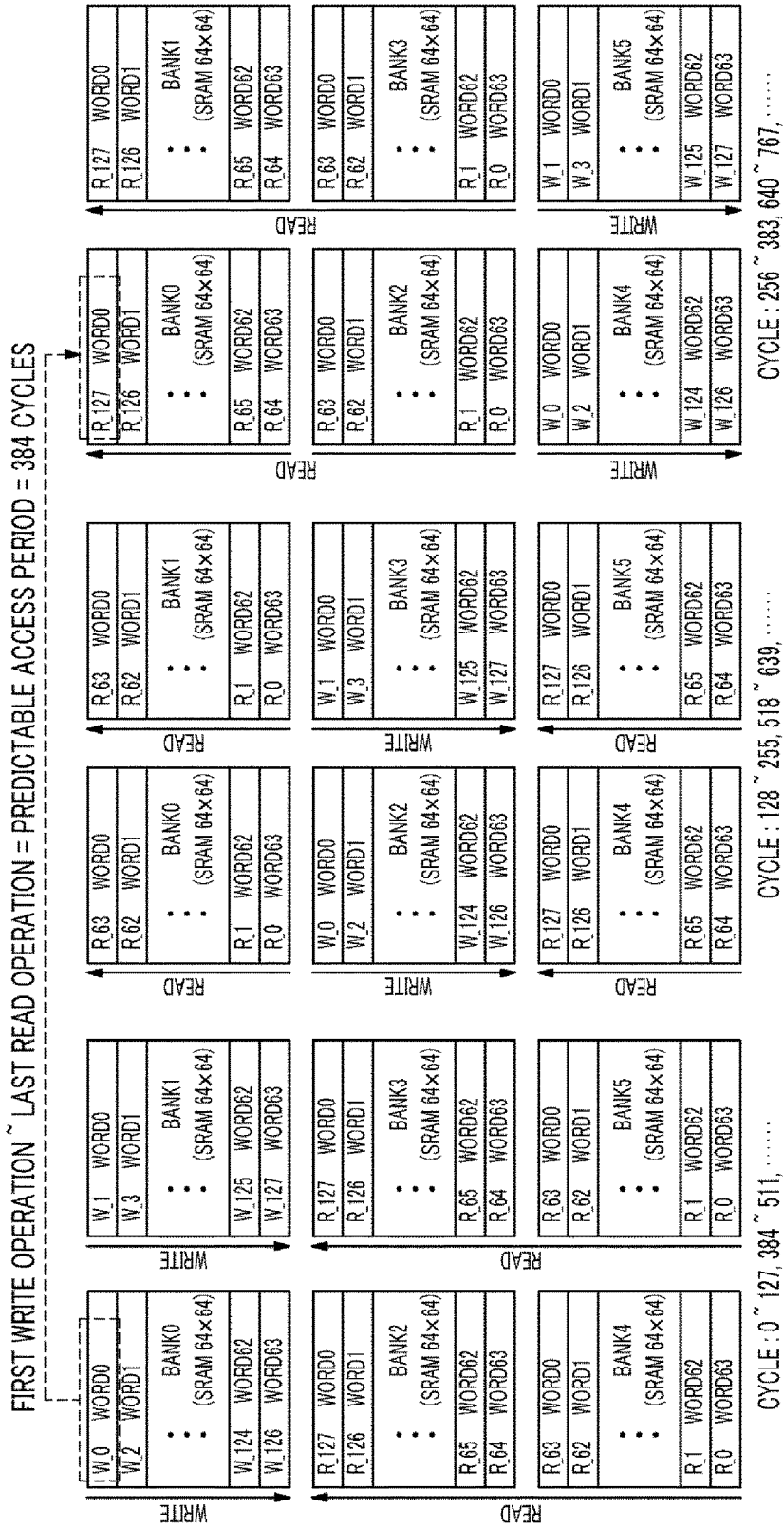
FIG. 1 is a diagram illustrating an example of a memory access pattern of a Viterbi decoder.

Hereinafter, embodiments of the present disclosure will be described in detail with reference to the accompanying drawings so that the present disclosure may be readily implemented by those skilled in the art. However, it is to be noted that the present disclosure is not limited to the embodiments but can be embodied in various other ways. In drawings, parts irrelevant to the description are omitted for the simplicity of explanation, and like reference numerals denote like parts through the whole document.

Through the whole document, the term "connected to" or "coupled to" that is used to designate a connection or coupling of one element to another element includes both a case that an element is "directly connected or coupled to" another element and a case that an element is "electronically connected or coupled to" another element via still another element. Further, the term "comprises or includes" and/or "comprising or including" used in the document means that one or more other components, steps, operation and/or existence or addition of elements are not excluded in addition to the described components, steps, operation and/or elements unless context dictates otherwise. Through the whole document, the term "step of" does not mean "step for".

Figure 3:
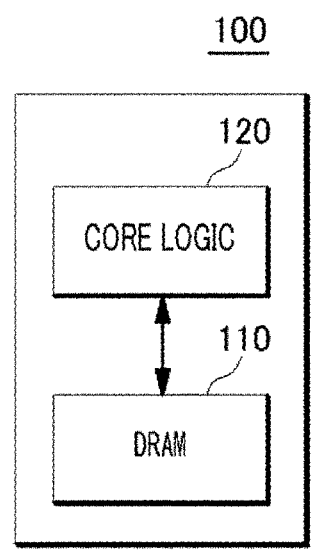
FIG. 3 is a block diagram of a digital signal processor.

FIG. 3 is a block diagram of a digital signal processor 100.

The digital signal processor 100 includes a DRAM 110 and a core logic 120.

Figure 2:
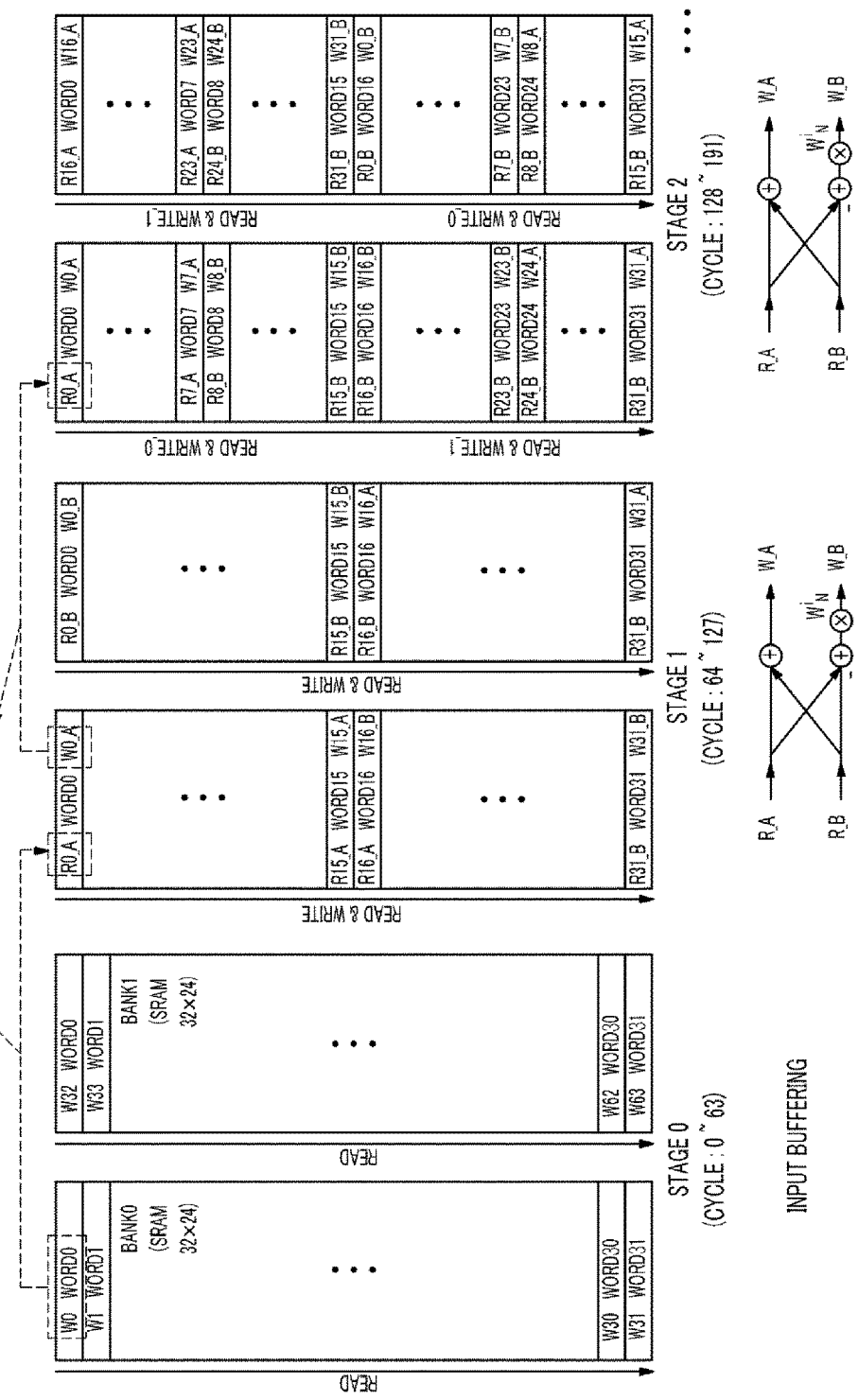
FIG. 2 is a diagram illustrating an example of a memory access pattern of a FFT processor.

For reference, each of components illustrated in FIG. 2 may imply software or hardware such as a field programmable gate array (FPGA) or an application specific integrated circuit (ASIC), and they carry out a predetermined function.

However, the components are not limited to the software or the hardware, and each of the components may be stored in an addressable storage medium or may be configured to implement one or more processors.

Accordingly, the components may include, for example, software, object-oriented software, classes, tasks, processes, functions, attributes, procedures, sub-routines and segments of program codes, drivers, firmware, micro codes, circuits, data, database, data structures, tables, arrays, variables and the like.

The components and functions thereof can be combined with each other or can be divided.

The DRAM 110 includes multiple memory cells configured to store data in a parasitic capacitor. The DRAM 110 used in the digital signal processor 100 will be described below with reference to FIG. 4.

Figure 4:
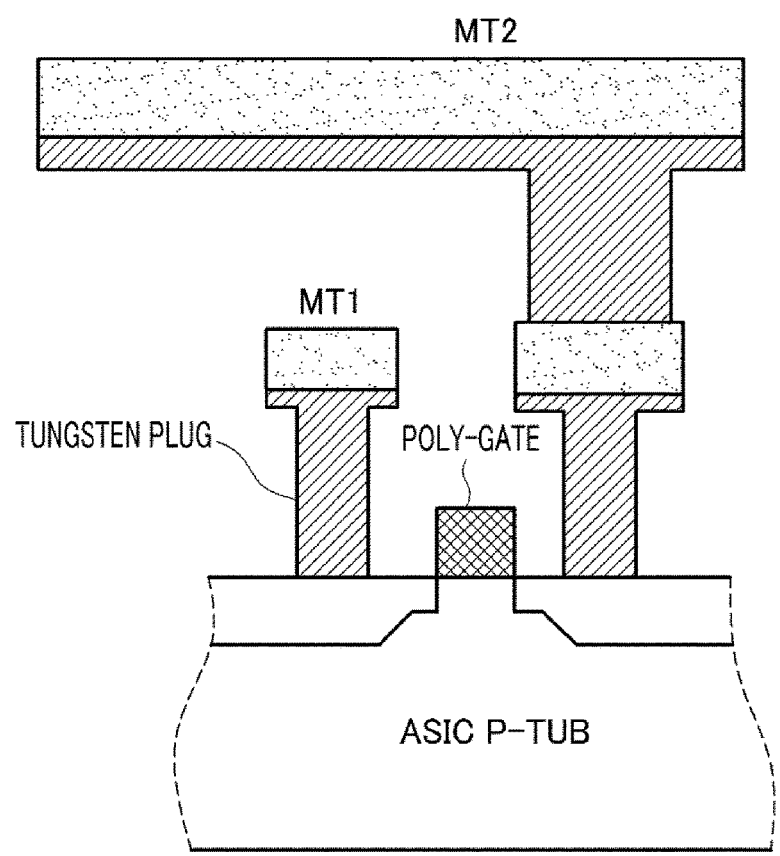
FIG. 4 is a cross-sectional view of a DRAM.

FIG. 4 is a cross-sectional view of a DRAM 110.

In a typical DRAM, there has been mainly used a stacked capacitor or a trench capacitor in which a deep groove is formed in a silicon substrate and a capacitance between both walls thereof is used in order to achieve high densification of a device. Therefore, when the typical DRAM is manufactured, an additional process for inserting the stacked capacitor or the trench capacitor needs to be performed.

However, in the DRAM 110, a parasitic capacitor of a MOSFET is substituted and used for a capacitor for storing data. Thus, it can be implemented in a general logic process without any additional process.

Referring to FIG. 3 again, the core logic 120 performs an operation of recording, reading, or updating data in the DRAM 110 on the basis of a predetermined digital signal processing architecture. At this time, the core logic 120 may previously set a Viterbi decoder, a FFT processor, or a LDPC decoder as a digital signal processing architecture and then record, read, or update data. Meanwhile, an architecture to be used in the digital signal processor 100 in some scenarios is not limited thereto. The above-described algorithms are just examples, and various algorithms can be applied.

Further, the core logic 120 records input data in a memory cell of the DRAM 110 and then, reads the recorded input data before a retention time passes and externally outputs the data. Otherwise, the core logic 120 may record input data in a memory cell of the DRAM 110 and then, store the recorded input data before a retention time passes in another memory cell of the DRAM 110. Thus, in the core logic 120, there is an effect of omitting a refresh operation. The effect of omitting a refresh operation will be described in detail with reference to FIG. 5.

Figure 5:
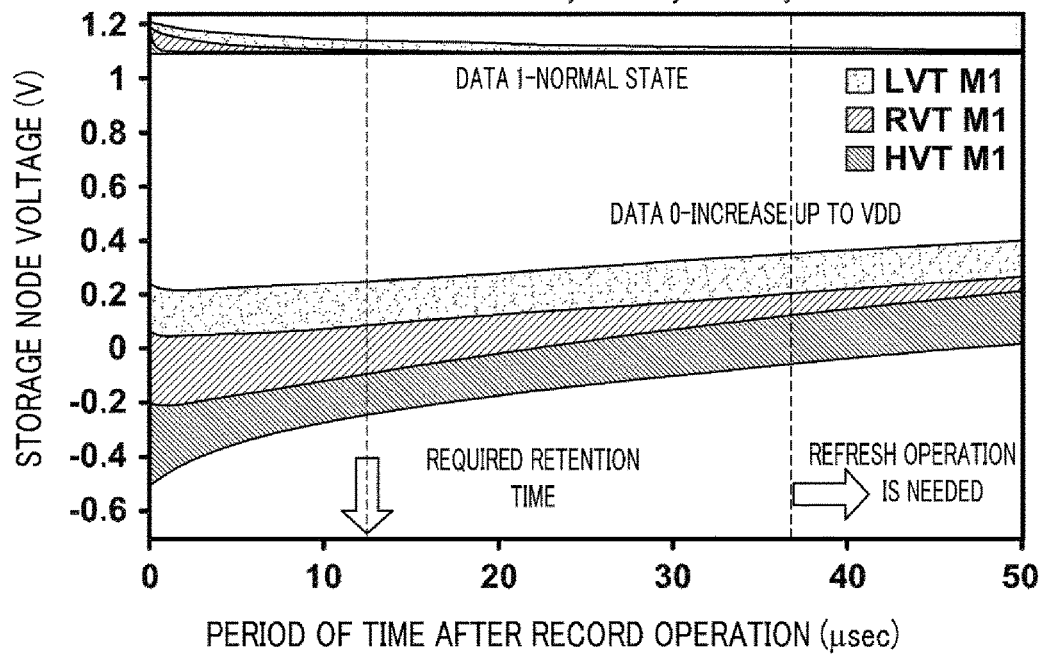
FIG. 5 is a graph of a voltage level in a digital signal processor.

FIG. 5 is a graph of a voltage level in a digital signal processor.

A dynamic random access memory such as a DRAM is configured to store data in the form of electric charges. Further, the electric charges stored in the dynamic random access memory dissipate due to a leakage current, so that a voltage difference between 0 and 1 is decreased. Therefore, the data stored in the memory can be lost. Further, a voltage level in the memory gradually increases up to VDD.

In order to suppress such a phenomenon, the digital signal processor 100 needs to perform a refresh operation of reading stored data from the memory cell before the data are lost and re-charging the memory cell to an initial quantity of electric charges adjusting to the read information. The data stored in the memory cell can be retained only when the digital signal processor 100 cyclically repeats the refresh operation of re-creating data.

As described above, the DRAM 110 gradually loses electric charges stored in a memory cell after a certain period of time passes. Therefore, the DRAM 110 may not trust the data stored in the memory cell anymore. Herein, a period of time during which data stored in a memory cell can be trusted is referred to as "retention time". That is, the DRAM 110 loses the data depending on a retention time as a characteristic of the memory cell.

Meanwhile, a retention time required for the DRAM 110 is determined by an architecture of the digital signal processor 100. At this time, the retention time is calculated on the basis of a traceback depth and a clock cycle (tclk). By way of example, a retention time in a memory of the digital signal processor 100 used in a Viterbi decoder can be calculated by the following equation 1.

$$3 \cdot \text{Traceback Depth}(128) \times \text{tclk}(1/54 \text{ Mbps}) = 7.12 \text{ } \mu\text{sec.} \quad \text{[Equation 1]}$$

As such, before a required retention time, i.e., 7.12 μsec, passes, the digital signal processor 100 reads input data and then, externally outputs the data or stores the data in another memory cell of the DRAM 110. Therefore, the digital signal processor 100 has an effect of omitting the refresh operation.

Meanwhile, the DRAM 110 in the digital signal processor 100 may include both of an input port and an output port. A memory cell of the DRAM 110 will be described below with reference to FIG. 6.

Figure 6:
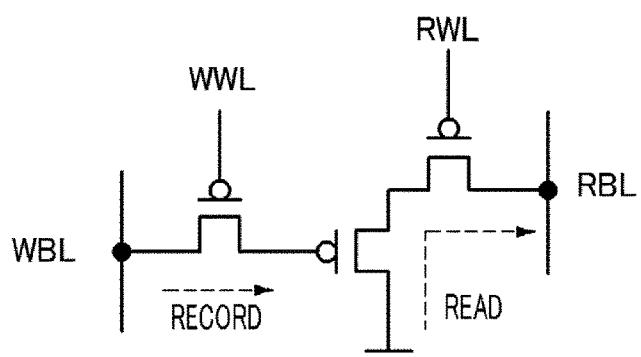
FIG. 6 is a diagram illustrating an example of a memory cell of a DRAM.

FIG. 6 is a diagram illustrating an example of a memory cell of a DRAM.

A bank of a typical single-port memory cell cannot perform a read operation and a write operation at the same time. Therefore, the typical single-port memory cell needs 6 banks or 3 banks. Accordingly, a DRAM including the typical single-port memory cell has an additional area, and, thus, the area efficiency is decreased.

In order to solve such a problem, the DRAM 110 in the digital signal processor 100 includes both of an input port and an output port. Therefore, the DRAM 110 can be operated with the dual port. In this case, a bank of a memory cell in the DRAM can perform a read operation and a write operation at the same time. As a result, an additional area of the memory can be shared, and, thus, the area efficiency of the digital signal processor 100 is increased. Further, power consumption in the digital signal processor 100 can be reduced.

Figure 7:
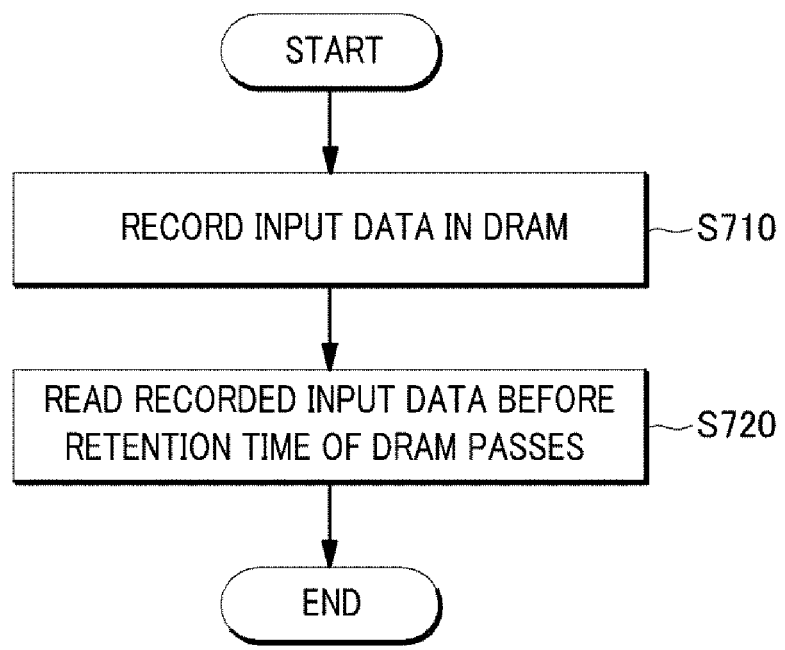
FIG. 7 is a flowchart of a data inputting/outputting method in a digital signal processor.

FIG. 7 is a flowchart of a data inputting/outputting method in a digital signal processor.

Firstly, the digital signal processor 100 records input data in the DRAM 110 including multiple memory cells configured to store data in a parasitic capacitor. Generally, a stacked capacitor or a trench capacitor is mainly used in a DRAM, and, thus, an additional process for inserting the capacitor needs to be performed.

However, in the DRAM 110 used in the present disclosure, a parasitic capacitor of a MOSFET is substituted and used for a capacitor for storing data in the DRAM 110. Thus, the DRAM 110 can be implemented in a general logic process without any additional process.

Then, after the input data are recorded, the digital signal processor 100 reads the recorded input data before a retention time of the DRAM 110 passes. Such an operation may be performed by the core logic 120. The core logic 120 performs an operation of recording, reading, or updating data in the DRAM 110 on the basis of a predetermined digital signal processing architecture. Herein, the predetermined digital signal processing architecture may be any one of a Viterbi decoder, a FFT processor, or a LDPC decoder which have periodic memory access pattern.

Meanwhile, an architecture to be used for the data inputting/outputting method in the digital signal processor 100 in accordance with some scenarios is not limited thereto, and various architectures can be applied. And the effect of omitting a refresh operation has been described in detail in FIG. 3, and, thus, will be omitted hereinafter.

The DRAM 110 used for the data inputting/outputting method in the digital signal processor 100 includes both of an input port and an output port. That is, the DRAM 110 can be operated with the dual port. Thus, a bank of a memory cell in the DRAM 110 can perform a read operation and a write operation at the same time. As a result, an additional area of the DRAM 110 can be shared. And the area efficiency of the digital signal processor 100 is increased. Further, thanks to the reduced load capacitor caused by reduced area, power consumption in the digital signal processor 100 can be reduced.

The above description of the present disclosure is provided for the purpose of illustration, and it would be understood by those skilled in the art that various changes and modifications may be made without changing technical conception and essential features of the present disclosure. Thus, it is clear that the above-described embodiments are illustrative in all aspects and do not limit the present disclosure. For example, each component described to be of a single type can be implemented in a distributed manner. Likewise, components described to be distributed can be implemented in a combined manner.

The scope of the present disclosure is defined by the following claims rather than by the detailed description of the embodiment. It shall be understood that all modifications and embodiments conceived from the meaning and scope of the claims and their equivalents are included in the scope of the present disclosure.

We claim:

1. A digital signal processor comprising:
   a DRAM including multiple memory cells configured to store data in a parasitic capacitor, and dual ports configured to perform a read operation and a write operation at the same time; and
   a core logic configured to perform an operation of recording, reading, or updating data in the DRAM on the basis of a predetermined digital signal processing architecture;
   wherein the core logic is configured to record input data in a memory cell of the DRAM and omit a refresh operation by reading the recorded input data before a retention time passes, and storing the recorded input data in another memory cell of the DRAM; and
   wherein the retention time is a basis of a traceback depth and a clock cycle of the predetermined digital signal processing architecture.

2. The digital signal processor of claim 1, wherein the digital signal processing architecture is any one of a Viterbi decoder, a FFT processor, or a LDPC decoder.

3. A data inputting/outputting method in a digital signal processor, comprising:
   recording input data in a DRAM including multiple memory cells configured to store data in a parasitic capacitor; and
   reading the recorded input data before a retention time of the DRAM passes, and storing the recorded input data in another memory cell of the DRAM without a refresh operation;
   wherein the recording and the reading are performed on the basis of a predetermined digital signal processing architecture; and
   wherein the retention time is a basis of a traceback depth and a clock cycle of the predetermined digital signal processing architecture.

4. The data inputting/outputting method of claim 3, wherein the DRAM includes an input port and an output port.

5. The data inputting/outputting method of claim 3, wherein the digital signal processing architecture is any one of a Viterbi decoder, a FFT processor, or a LDPC decoder.

* * * * *